(12) United States Patent
Larsen et al.

(10) Patent No.: US 10,257,625 B2
(45) Date of Patent: Apr. 9, 2019

(54) HEARING DEVICE COMPRISING SWITCHED CAPACITOR DC-DC CONVERTER WITH LOW ELECTROMAGNETIC EMISSION

(71) Applicant: GN HEARING A/S, Ballerup (DK)

(72) Inventors: Dennis Øland Larsen, Norrebro (DK); Ivan Riis Nielsen, Ganlose (DK)

(73) Assignee: GN HEARING A/S, Ballerup (DK)

( * ) Notice: Subject to any disclaimer, the term of this patent is extended or adjusted under 35 U.S.C. 154(b) by 0 days.

(21) Appl. No.: 15/816,600

(22) Filed: Nov. 17, 2017

(65) Prior Publication Data
US 2018/0317029 A1 Nov. 1, 2018

(30) Foreign Application Priority Data

Apr. 28, 2017 (EP) ..................................... 17168588

(51) Int. Cl.
| | | |
|---|---|---|
| *H04R 25/00* | (2006.01) | |
| *H04R 1/00* | (2006.01) | |
| *H04R 9/06* | (2006.01) | |
| *H04R 11/02* | (2006.01) | |
| *H02M 3/07* | (2006.01) | |
| *H04B 5/00* | (2006.01) | |

(Continued)

(52) U.S. Cl.
CPC ............ *H04R 25/554* (2013.01); *H02M 3/07* (2013.01); *H02M 3/18* (2013.01); *H03H 19/004* (2013.01); *H04B 5/0081* (2013.01); *H04R 25/505* (2013.01); *H02M 2003/072* (2013.01); *H04R 2225/33* (2013.01); *H04R 2225/51* (2013.01); *H04R 2225/61* (2013.01)

(58) Field of Classification Search
CPC .......... H04B 5/0081; H02M 2003/072; H02M 3/07; H04R 2225/51; H04R 25/505; H04R 25/554

USPC .................................................. 381/312, 315
See application file for complete search history.

(56) References Cited

U.S. PATENT DOCUMENTS

| | | | | |
|---|---|---|---|---|
| 4,689,803 A | * | 8/1987 | Johannessen | ........... H04L 27/12 375/304 |
| 5,949,264 A | * | 9/1999 | Lo | ......................... H03D 13/004 327/148 |

(Continued)

FOREIGN PATENT DOCUMENTS

EP        2 590 311 A1     5/2013

OTHER PUBLICATIONS

Extended European Search Report and Search Opinion dated Oct. 9, 2017 for corresponding European Application No. 17168588.6.

*Primary Examiner* — Khai N. Nguyen
(74) *Attorney, Agent, or Firm* — Vista IP Law Group, LLP

(57) ABSTRACT

The present disclosure relates to a head-wearable hearing device which comprises a magnetic inductance antenna having a predetermined resonance period for receipt of wireless data signals and a switched capacitor DC-DC converter configured for converting a DC input voltage into a higher or lower DC output voltage in accordance with a clock signal. The charge pump circuit is configured to charge an output capacitor by output current pulses where the output current pulses at least comprise first and second consecutive output current pulses having a mutual pulse delay corresponding to substantially one-half of the predetermined resonance period of the magnetic inductance antenna.

23 Claims, 8 Drawing Sheets

(51) Int. Cl.
*H02M 3/18* (2006.01)
*H03H 19/00* (2006.01)

(56) References Cited

U.S. PATENT DOCUMENTS

| | | | | |
|---|---|---|---|---|
| 6,055,168 | A * | 4/2000 | Kotowski | H02M 3/07 307/110 |
| 6,320,435 | B1 * | 11/2001 | Tanimoto | H03L 7/0893 327/156 |
| 6,370,046 | B1 | 4/2002 | Nebrigic et al. | |
| 8,633,766 | B2 * | 1/2014 | Khlat | H02M 3/07 323/222 |
| 9,209,912 | B2 * | 12/2015 | May | H04B 15/04 |
| 2005/0111681 | A1 | 5/2005 | Essabar | |
| 2008/0061191 | A1 * | 3/2008 | Gochnour | B64C 39/001 244/171.5 |
| 2009/0058507 | A1 * | 3/2009 | Nandi | H02M 3/07 327/536 |
| 2009/0243578 | A1 * | 10/2009 | Wahby | H02M 3/157 323/283 |
| 2010/0019832 | A1 * | 1/2010 | Pan | H02M 3/07 327/536 |
| 2011/0043140 | A1 | 2/2011 | Shiu | |
| 2012/0235730 | A1 | 9/2012 | Quan et al. | |
| 2012/0313701 | A1 * | 12/2012 | Khlat | H02M 3/07 330/127 |
| 2014/0148899 | A1 * | 5/2014 | Fehr | A61F 2/1624 623/6.22 |
| 2015/0180355 | A1 * | 6/2015 | Freeman | H02M 1/08 363/21.04 |
| 2015/0181352 | A1 | 6/2015 | Astgimath et al. | |
| 2016/0054747 | A1 * | 2/2016 | Cohen | G05F 1/567 713/300 |
| 2016/0126838 | A1 * | 5/2016 | Cavallini | H02M 3/158 315/185 R |
| 2018/0123451 | A1 * | 5/2018 | Larsen | H02M 1/14 |
| 2018/0124529 | A1 * | 5/2018 | Larsen | H02M 3/07 |

* cited by examiner

HEARING DEVICE COMPRISING SWITCHED CAPACITOR DC-DC CONVERTER WITH LOW ELECTROMAGNETIC EMISSION

RELATED APPLICATION DATA

This application claims priority to, and the benefit of, European Patent Application No. 17168588.6, filed on Apr. 28, 2017, pending. The entire disclosure of the above application is expressly incorporated by reference herein.

FIELD

The present disclosure relates to a head-wearable hearing device which comprises a magnetic inductance antenna having a predetermined resonance period for receipt of wireless data signals and a switched capacitor DC-DC converter configured for converting a DC input voltage into a higher or lower DC output voltage in accordance with a clock signal. The charge pump circuit is configured to charge an output capacitor by output current pulses where the output current pulses at least comprise first and second consecutive output current pulses having a mutual pulse delay corresponding to substantially one-half of the predetermined resonance period of the magnetic inductance antenna.

BACKGROUND

Switched capacitor DC-DC power converters are known in the art and have previously been utilized in various types of head-wearable hearing devices such as hearing aids and hearing instruments. Switched capacitor DC-DC power converters are often utilized to convert a DC input voltage delivered by an energy or power source, such as a rechargeable battery, of the hearing device into a higher or lower DC output voltage suitable for various types of active components of the device. Switched capacitor DC-DC power converters possess certain attractive properties compared to their inductor-based counterparts—for example a relatively low level of electromagnetic emission due to the lack of stored energy in magnetic fields of inductors. Dimensions of switched capacitor DC-DC power converters may be compact and their energy conversion efficiency relatively high. Different topologies of switched capacitor DC-DC power converters are capable of providing DC voltage step-up (i.e. boost) and DC voltage step-down (i.e. buck) with a topology dependent optimum voltage conversion ratio for example 1:2 or 1:3 step-up conversion and 2:1 and 3:1 step-down conversion.

The head-wearable hearing devices may additionally comprises a magnetic inductance antenna for receipt and/or transmission of magnetically coupled wireless data signals through a wireless communication channel or link. The wireless communication channel may form part of an ear-to-ear communication system of a binaural hearing aid system allowing data signals and digital audio signals to be exchanged between the head-wearable hearing device and another head-wearable hearing device mounted at, or in, the user's opposite ear. Co-existence of the magnetic inductance antenna and the switched capacitor DC-DC converter often represents a significant challenge because of the very compact dimension of a housing of the head-wearable hearing device. The compact housing dimensions limit the maximum physical distance between the magnetic inductance antenna and the DC-DC power converter and its associated wiring and external components. Hence, pulsed electromagnetic noise bursts caused by charging current pulses running in the flying capacitor(s) and output capacitor(s) of the switched capacitor DC-DC converter are rather effectively coupled into the magnetic inductance antenna as interfering noise pulses that deteriorate reception of the desired wireless digital data signals.

Hence, there remains a need in the art for improvements of switched capacitor DC-DC converters to achieve reductions of electromagnetic noise disturbances of magnetic inductance antennas of head-wearable hearing devices like hearing aids and headsets.

SUMMARY

A first aspect relates to a head-wearable hearing device comprising:
 a magnetic inductance antenna for receipt of wireless data signals through a wireless communication channel; said magnetic inductance antenna exhibiting a predetermined resonance period;
 a switched capacitor DC-DC converter configured for converting a DC input voltage into a higher or lower DC output voltage in accordance with a clock signal. The switched capacitor DC-DC converter is comprising a charge pump circuit configured to charge an output capacitor by output current pulses; the charge pump circuit configured for, in a first state, charge the output capacitor and a flying capacitor from the DC input voltage; and, in a second state, discharge the flying capacitor into the output capacitor; wherein the output current pulses at least comprise first and second consecutive output current pulses with a mutual pulse delay corresponding to substantially one-half of the predetermined resonance period of the magnetic inductance antenna.

The head-wearable hearing device may be a hearing aid, such as a BTE, RIE, ITE, ITC, or CIC, etc., hearing aid. The hearing aid may comprise one or several microphone(s) for picking-up sound from the external environment of the hearing instrument and generate a first audio signal in response. The head-wearable hearing device may alternatively be a headset, headphone, earphone, ear defender, or earmuff, etc., such as an Ear-Hook, In-Ear, On-Ear, Over-the-Ear, Behind-the-Neck, Helmet, or Headguard, etc.

The flying capacitor may comprise an external capacitor relative to an integrated circuit on which the switched capacitor DC-DC converter is integrated together with other active circuit blocks of the head-wearable hearing device. The flying capacitor may in the alternative be fully integrated on the integrated circuit, i.e. an on-chip capacitor integrally formed on a semiconductor die or substrate of the integrated circuit. In both cases, the skilled person will understand that the output current pulses flowing through the output capacitor, the flying capacitor and associated wiring lead to the emission of the previously discussed magnetic or electromagnetic noise pulses or switching noise that are coupled into the magnetic inductance antenna as interfering switching noise. However, by setting the mutual pulse delay between the first and second consecutive output, or charging, current pulses substantially equal to one-half of the predetermined resonance period of the magnetic inductance antenna, the level of the switching noise induced in the magnetic inductance antenna can be markedly reduced. This reduction of the switching noise level is achieved by destructive interference between first and second consecutive switching noise pulses induced in the magnetic inductance antenna by the first and second consecutive output current pulses, respectively, as discussed in further detail below with reference to the appended drawings. The skilled person will appreciate that the charge pump circuit repeatedly generates output current pulses to repeatedly charge the output capacitor and control the DC output voltage during operation. The output current pulses will therefore typically comprise multiple pairs of consecutive output current pulses each pair having the mutual pulse delay of substantially one-half of the predetermined resonance period of the magnetic inductance antenna.

The skilled person will likewise understand that the cancellation or suppression of the interfering switching noise in the magnetic inductance antenna is generally most effective, or optimal, if the mutual pulse delay between the first and second output current pulses equals one-half of the predetermined resonance period of the magnetic inductance antenna. However, considerable suppression of the interfering switching noise is also achieved at minor deviations of the mutual pulse delay from this optimum value and therefore falls within the scope of the present disclosure. Hence, in the present specification the qualifier "substantially" with respect to the mutual pulse delay preferably means mutual pulse delays which equal one-half of the predetermined resonance period of the magnetic inductance antenna within a tolerance of +/−50%, or more preferably within +/−25%, or even more preferably within +/−10%. Hence, with a 100 ns resonance period of the magnetic inductance antenna (corresponding to an antenna tuning frequency of 10 MHz), the optimum mutual pulse delay is 50 ns, i.e. equaling one-half of the 100 ns resonance period, while significant suppression of the interfering switching noise in the magnetic inductance antenna is still achieved with mutual pulse delays between 25 ns and 75 ns, i.e. 50 ns +/−50%. Even better suppression is achieved of the interfering switching noise is achieved with mutual pulse delays between 37.5 ns and 62.5 ns, i.e. 50 ns +/−25%. Consequently, a significant suppression of the interfering switching noise is achieved even under conditions where the mutual pulse delay deviates from the optimum value within the above-mentioned preferred upper and lower bounds as discussed in additional detail below with reference to the appended drawings. This property makes the suppression of the interfering switching noise robust against practical variations of the clock signal frequency and antenna tuning frequency—for example caused by component tolerances, ageing effects, temperature drift etc.

The charge pump circuit may comprise a switch array driven by first and second non-overlapping clock phases derived from the clock signal wherein said first and second non-overlapping clock phases are defining the first state and second state, respectively, of the charge pump circuit. The first state of the charge pump circuit may comprise a charging of the flying capacitor and output capacitor and the second state of the charge pump circuit may comprise discharging the flying capacitor into the output capacitor as discussed in additional detail below with reference to the appended drawings. The switch array may at least comprise first and second controllable semiconductor switches driven by the first clock phase for connecting the flying capacitor between the DC input voltage and the output capacitor during the first clock phase. The switch array may additionally comprise third and fourth controllable semiconductor switches driven by the second clock phase for connecting the flying capacitor to the output capacitor during the second clock phase.

The predetermined resonance period of the magnetic inductance antenna may lie between 20 ns and 200 ns. These time periods correspond to a resonance or tuning frequency of the magnetic inductance antenna between 50 MHz and 5 MHz, respectively.

The frequency of the clock signal of the switched capacitor DC-DC converter may lie between 250 kHz and 4 MHz such as between 500 kHz and 2.0 MHz. The frequency of the clock signal may set the switching frequency of the charge pump circuit since the first and second clock phases are derived from the clock signal.

Some embodiments of the switched capacitor DC-DC converter may utilize a so-called pulse-skipping mechanism to achieve regulation of the DC output voltage. In this embodiment, the time span between consecutive clock pulses of the clock signal varies depending on the load. According to this embodiment, each clock pulse of the consecutive clock pulses has a length substantially equal to one-half of the predetermined resonance period, where substantially again means preferably within a tolerance of +/−50%. In addition, the charge pump circuit is configured to producing the first output current pulse of the output current pulses in response to an on-state transition of the first clock phase and producing the second consecutive output current pulse of the output current pulses in response to an on-state transition of the second clock phase.

According to another embodiment of the switched capacitor DC-DC converter, the cycle time of the clock signal is longer than one-half of the predetermined resonance period—for example between 5 times and 20 times longer to reduce the switching frequency of the charge pump circuit and reduce its power consumption. According to this embodiment, the charge pump circuit is configured to generate a pair of consecutive output current pulses during the first clock phase and generate a pair of consecutive output current pulses during the second clock phase. The charge pump circuit may therefore be configured to:

producing the first output current pulse of the output current pulses in response to an on-state transition of the first clock phase to at least partially charge the flying capacitor;

producing the second, and consecutive, output current pulse, of the output current pulses, at the mutual pulse delay relative to the on-state transition of the first clock phase to increase the charge of the flying capacitor; and producing a third output current pulse of the output current pulses in response to an on-state transition of the second clock phase to partially discharge the flying capacitor;

producing a fourth output current pulse, consecutive to the third output current pulse, of the output current pulses at the mutual pulse delay relative to the on-state transition of the second clock phase to further discharge the flying capacitor.

According to certain embodiments, each of the first and second, controllable semiconductor switches comprises at least two individually controllable switch segments to selectively generate the first and second output current pulses by turning-on the least two individually controllable switch segments. According to one such embodiment, each of the first and second controllable semiconductor switches comprises individually controllable first and second switch segments controlled by first and second segment phases, respectively, derived from the first clock phase, to produce the first and second charging current pulses; wherein on-set or transition of the second segment phase is delayed relative to on-set or transition of the first segment phase by the mutual pulse delay. Likewise, each of the third and fourth controllable semiconductor switches preferably comprises individually controllable first and second switch segments controlled by third and fourth segment phases, respectively, derived from the second clock phase, to produce the third and fourth consecutive output current pulses; wherein on-set or transition of the fourth segment phase is delayed relative to on-set or transition of the third segment phase by the mutual pulse delay.

The skilled person will understand that the cancellation or suppression of the interfering switching noise in the magnetic inductance antenna generally is most effective if the waveforms of the first and second output current pulses are identical or at least largely identical. The same constraints naturally apply to all the pairs of consecutive output current pulses. Some embodiments of the charge pump circuit are therefore configured to produce identical polarities and substantially identical peak currents of the first and second consecutive output current pulses. The substantially identical peak currents may be achieved when a peak current difference between the first and second output current pulses is less than +/−50%, more preferably less than +/−25%, even more preferably less than +/−10%.

According to certain embodiments, the respective peak currents of the first and second consecutive output current pulses are controlled by selecting appropriate on-resistances of the first and second individually controllable switch segments of each of the controllable semiconductor switches of the charge pump circuit. In one such embodiment the respective on-resistances of the first and second individually controllable switch segments of each of the first and second controllable semiconductor switches are selected to produce the substantially identical peak currents of the first and second consecutive output current pulses of the output current pulses, and on-resistances of the first and second individually controllable switch segments of each of the third and fourth controllable semiconductor switches are selected to produce the substantially identical peak currents of the third and fourth consecutive output current pulses.

The DC input voltage of the switched capacitor DC-DC power converter may be supplied by rechargeable battery cell(s) or disposable battery cell or cells. The battery cell or cells may for example comprise a disposable Zn-Air battery or may comprise at least one rechargeable Li-Ion battery cell. In the latter embodiment, the least one rechargeable Li-Ion battery cell may deliver a nominal DC input voltage at around 4.0 V for the switched capacitor DC-DC converter. The switched capacitor DC-DC converter may in the latter embodiment be configured to step-down the received DC input voltage with a factor of approximately 2:1 and/or 3:1, depending on a charging state of the Li-Ion battery cell, to supply DC output voltage level of about 1.2 V.

However, the skilled person will understand the switched capacitor DC-DC converter may be configured to step-up the batter supply voltage with certain ratios, e.g. 1:2 and/or 1:3, for other types of rechargeable battery sources delivering nominal battery voltages below 1.2 V.

The head-wearable hearing device may comprise various active components and audio transducers for receipt of incoming speech and other sound signals, processing of received sound signals and conversion of the processed sound signals into a corresponding output sound signal for application to a user's ear and/or transmission to a remote listener. The head-wearable hearing device may comprise a hearing aid which additionally comprises:

a control and processing circuit comprising:
a first audio input channel for receipt of a first audio signal and a signal processor for receipt and processing of the first audio signal for generating a compensated microphone signal according to a hearing loss of a user;
a class D output amplifier for receipt of the compensated microphone signal and generation of a modulated output signal at a predetermined modulation frequency,
a miniature receiver or loudspeaker for receipt of the modulated output signal and generation of output sound signal for application to a user's ear. The compensated microphone signal may be embedded or encoded in the wireless data signals transmitted by the magnetic inductance antenna. The compensated microphone signal may be transmitted to another hearing aid comprising a corresponding magnetic inductance antenna and compatible receipt and decoding circuitry for the encoded wireless data signals.

The first audio signal may be derived from a microphone of the hearing aid or may be derived from the wireless data signals supplied by the magnetic inductance antenna by appropriate decoding. Hence, the wireless data signals may be supplied by a remote audio signal source such as a portable microphone, another hearing instrument or a mobile phone etc. The class D output amplifier may be powered directly by the DC output voltage supplied by the switched capacitor DC-DC converter.

The signal processor may comprise dedicated digital logic circuitry, a software programmable processor or any combination thereof. As used herein, the terms "processor", "signal processor", "controller", "system", etc., are intended to refer to microprocessor or CPU-related entities, either hardware, a combination of hardware and software, software, or software in execution. For example, a "processor", "signal processor", "controller", "system", etc., may be, but is not limited to being, a process running on a processor, a processor, an object, an executable file, a thread of execution, and/or a program. By way of illustration, the terms "processor", "signal processor", "controller", "system", etc., designate both an application running on a processor and a hardware processor. One or more "processors", "signal processors", "controllers", "systems" and the like, or any combination hereof, may reside within a process and/or thread of execution, and one or more "processors", "signal processors", "controllers", "systems", etc., or any combination hereof, may be localized on one hardware processor, possibly in combination with other hardware circuitry, and/or distributed between two or more hardware processors, possibly in combination with other hardware circuitry. Also, a processor (or similar terms) may be any component or any combination of components that is capable of performing signal processing. For examples, the signal processor may be an ASIC processor, a FPGA processor, a general purpose processor, a microprocessor, a circuit component, or an integrated circuit.

A second aspect relates to a method of reducing electromagnetic noise disturbances of a magnetic inductance antenna caused by a switched capacitor DC-DC converter of a head-wearable hearing device; The methodology comprising:
a) generating a clock signal;
b) applying the clock signal to the switched capacitor DC-DC converter to convert a DC input voltage into a higher or lower DC output voltage at an output capacitor,
c) supplying output current pulses into the output capacitor for charging the output capacitor, e) setting a time delay between at least first and second consecutive output current pulses of the output current pulses equal to substantially one-half of a predetermined resonance period of the magnetic inductance antenna, f) repeating step e) multiple times in accordance with the clock signal to apply multiple pairs of consecutive output current pulses to the output capacitor over time to repeatedly charge the output capacitor.

One embodiment of this methodology additionally comprises:

g) deriving first and second non-overlapping clock phases from the clock signal, h) charge the flying capacitor and the output capacitor by the DC input voltage during a first clock phase, i) discharge the flying capacitor into the output capacitor during the second clock phase.

A head-wearable hearing device includes: a magnetic inductance antenna for receipt of wireless data signals; and a switched capacitor DC-DC converter configured to convert a DC input voltage into a higher or lower DC output voltage, the switched capacitor DC-DC converter comprising a charge pump circuit configured to charge an output capacitor by output current pulses; wherein the output current pulses at least comprise first and second output current pulses with a mutual pulse delay corresponding to substantially one-half of a resonance period of the magnetic inductance antenna.

Optionally, head-wearable hearing device further includes a flying capacitor, wherein the charge pump circuit is configured to, in a first state, charge the output capacitor and the flying capacitor from the DC input voltage.

Optionally, the charge pump circuit is configured to, in a second state, discharge the flying capacitor.

Optionally, the charge pump circuit is configured to, in the second state, discharge the flying capacitor into the output capacitor.

Optionally, the switched capacitor DC-DC converter is configured to convert the DC input voltage into the higher or lower DC output voltage in accordance with a clock signal.

Optionally, a frequency of the clock signal is smaller than one-half of the resonance period.

Optionally, a frequency of the clock signal is between 250 kHz and 4 MHz.

Optionally, the charge pump circuit comprises a switch array driven by first and second non-overlapping clock phases derived from a clock signal, the first and second non-overlapping clock phases corresponding with a first state and a second state, respectively, of the charge pump circuit.

Optionally, the head-wearable hearing device further includes a flying capacitor, wherein the switch array comprises: first and second controllable semiconductor switches for connecting the flying capacitor between the DC input voltage and the output capacitor during the first clock phase; and third and fourth controllable semiconductor switches for connecting the flying capacitor to the output capacitor during the second clock phase.

Optionally, each of the first and second controllable semiconductor switches comprises individually controllable first and second switch segments controlled by first and second segment phases, respectively, derived from the first clock phase, wherein an on-set or transition of the second segment phase is delayed relative to an on-set or transition of the first segment phase by the mutual pulse delay; and each of the third and fourth controllable semiconductor switches comprises individually controllable first and second switch segments controlled by third and fourth segment phases, respectively, derived from the second clock phase, wherein an on-set or transition of the fourth segment phase is delayed relative to an on-set or transition of the third segment phase by the mutual pulse delay.

Optionally, the charge pump circuit is configured to operate based on a clock signal, the clock signal comprising a plurality of clock pulses, wherein each of the clock pulses has a length substantially equals to one-half of the resonance period.

Optionally, the charge pump circuit is configured to: produce the first output current pulse of the output current pulses in response to an on-state transition of a first clock phase; and produce the second output current pulse of the output current pulses in response to an on-state transition of a second clock phase.

Optionally, the head-wearable hearing device further includes a flying capacitor, wherein the charge pump circuit is configured to: produce the first output current pulse of the output current pulses in response to an on-state transition of a first clock phase to at least partially charge the flying capacitor; and produce the second output current pulse of the output current pulses, at the mutual pulse delay relative to the on-state transition of the first clock phase to increase the charge of the flying capacitor.

Optionally, the charge pump circuit is also configured to: produce a third output current pulse of the output current pulses in response to an on-state transition of a second clock phase to at least partially discharge the flying capacitor; and produce a fourth output current pulse of the output current pulses at the mutual pulse delay relative to the on-state transition of the second clock phase to further discharge the flying capacitor.

Optionally, the resonance period is between 20 ns and 200 ns.

Optionally, the resonance period corresponds with a resonance frequency that is between 5 MHz and 50 MHz.

Optionally, the head-wearable hearing further includes a control and processing circuit coupled to the switched capacitor DC-DC converter, the control and processing circuit comprising: a first audio input channel for receipt of a first audio signal, a signal processor for processing of the first audio signal to generate a compensated microphone signal according to a hearing loss of a user, an amplifier configured to provide a modulated output signal based on the compensated microphone signal, and a receiver or loudspeaker for providing output sound signal based on the modulated output signal.

Optionally, the head-wearable hearing device further includes a rechargeable battery source for providing the DC input voltage.

Optionally, the mutual pulse delay equals one-half of the resonance period of the magnetic inductance antenna within a tolerance of +/−50%, +/−25%, or +/−10%.

Optionally, the charge pump circuit is configured to produce peak currents associated with the first and second output current pulses, the peak currents being identical or having a difference less than 50%, 25%, or 10%.

A method performed by a head-wearable hearing device having a magnetic inductance antenna and a switched capacitor DC-DC converter, includes: generating a clock signal; applying the clock signal to the switched capacitor DC-DC converter to convert a DC input voltage into a higher or lower DC output voltage at an output capacitor; supplying output current pulses into the output capacitor for charging the output capacitor; and setting a time delay between at least first and second output current pulses of the output current pulses equal to substantially one-half of a resonance period of the magnetic inductance antenna.

Optionally, the method also includes repeating the act of setting the time delay to apply a pair of additional output current pulses to the output capacitor to repeat a charging of the output capacitor.

Optionally, the method further includes: deriving first and second non-overlapping clock phases from the clock signal; charging a flying capacitor in the hearing device and the output capacitor during the first clock phase; and discharging the flying capacitor during the second clock phase.

BRIEF DESCRIPTION OF THE DRAWINGS

Embodiments are described in more detail below with reference to the appended drawings, in which.

DESCRIPTION OF THE EMBODIMENTS

Figure 1:
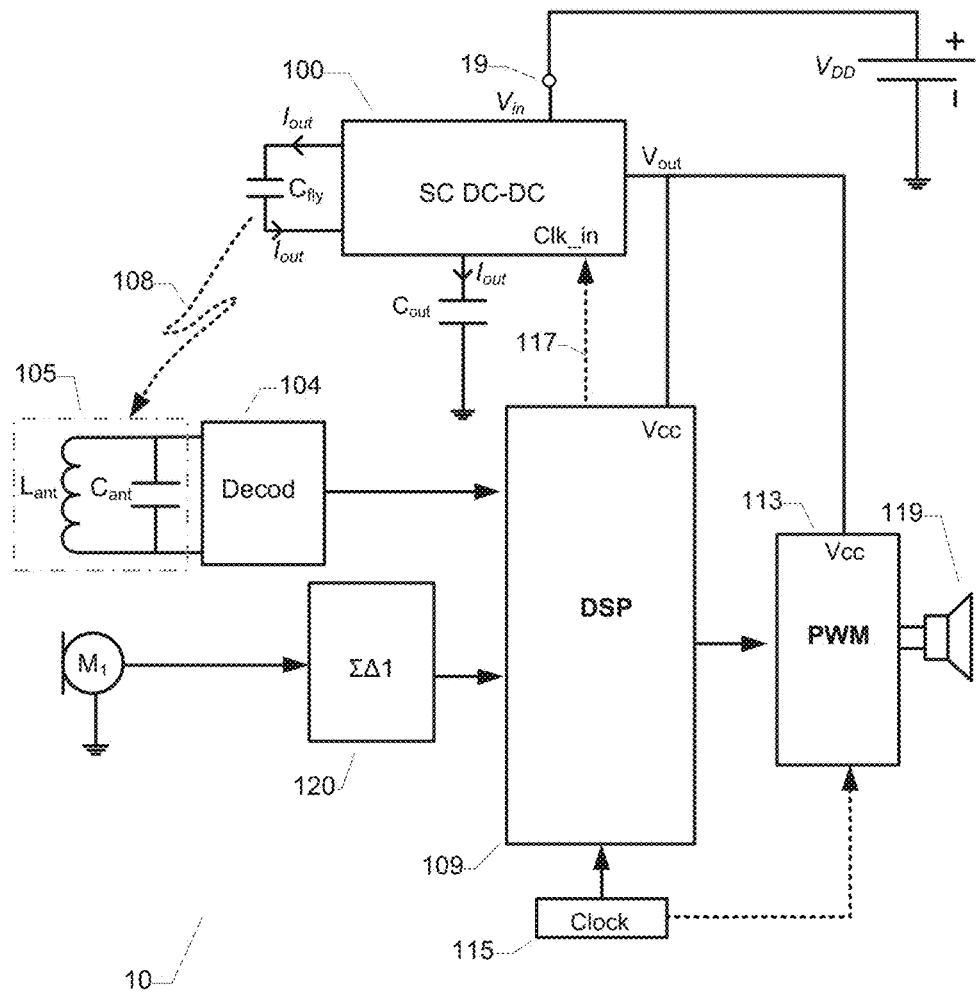
FIG. 1 shows a simplified schematic block diagram of an head wearable hearing device comprising an exemplary switched capacitor DC-DC converter and a magnetic inductance antenna according to some embodiments.

Various exemplary embodiments and details are described hereinafter, with reference to the figures when relevant. It should be noted that the figures may or may not be drawn to scale and that elements of similar structures or functions are represented by like reference numerals throughout the figures. Like elements or components will therefore not necessarily be described in detail with respect to each figure. It should also be noted that the figures are only intended to facilitate the description of the embodiments. They are not intended as an exhaustive description of the invention or as a limitation on the scope of the invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described.

In the following, various exemplary embodiments of a head wearable hearing device, e.g. a hearing aid, comprising a switched capacitor DC-DC converter and a magnetic inductance antenna are described with reference to the appended drawings. The skilled person will further appreciate that certain actions and/or steps may be described or depicted in a particular order of occurrence while those skilled in the art will understand that such specificity with respect to sequence is not actually required.

FIG. 1 shows a simplified schematic block diagram of an exemplary hearing aid or headset 10 comprising a switched capacitor DC-DC converter 100 according to any of the below-described embodiments thereof. The hearing aid 10 may comprise any type of hearing aid housing style such as Behind-the-Ear (BTE), In-the-Canal (ITC), Completely-in-Canal (CIC), RIC etc. for arrangement in, or at, a user's ear. The DC input voltage input V, of the switched capacitor DC-DC converter 100 may be supplied by a rechargeable battery cell or cells or an ordinary disposable Zn-air battery cell—$V_{DD}$. In either case, the battery source may be connected to the hearing instrument circuitry through a positive power supply terminal 19. The skilled person will understand that the switched capacitor DC-DC converter 100 may serve to step-up or step-down a DC voltage level supplied by the battery source $V_{DD}$ to a higher or lower DC voltage level which is better adapted to the active circuitry, e.g. leading to a lower power consumption, for active circuits or circuit blocks of the hearing aid 10. The battery source may for example comprise at least one rechargeable Li-Ion battery cell and may hence supply a nominal DC input voltage $V_{in}$ at around 4.0 V for the switched capacitor DC-DC converter 100. The switched capacitor DC-DC converter 100 may in that embodiment be configured to step-down the received DC input voltage with a factor of approximately 2:1 and/or 3:1, depending on a charging state of the Li-Ion battery cell, to supply a DC output voltage $V_{out}$ of about 1.2 V. An output/smoothing capacitor $C_{out}$ is connected to an output of the switched capacitor DC-DC converter 100 to supply and smooth the DC output voltage $V_{out}$. The switched capacitor DC-DC converter 100 additionally comprise at least one flying capacitor $C_{fly}$ that is connected to a charge pump circuit (not shown) and switch array of the converter 100 as discussed in additional detail below. The capacitance of the output/smoothing capacitor $C_{out}$ may be larger than 500 nF, such as between 1 and 10 µF, while the capacitance of the flying capacitor $C_{fly}$ may lie between 10 nF and 500 nF if the capacitor is an external component. The output/smoothing capacitor and the flying capacitor may both be external to an integrated circuit on which the switched capacitor DC-DC converter 100 is formed together with other active circuit blocks of the hearing instrument. In alternative embodiments of the switched capacitor DC-DC converter 100, the flying capacitor $C_{fly}$ may be integrated on the integrated circuit. The DC output voltage $V_{out}$ supplied by the switched capacitor DC-DC converter 100 may in certain embodiments of the hearing aid 10 be utilized to directly power a class D output amplifier 113 of the hearing aid as illustrated.

The hearing aid 10 additionally comprises at least one microphone $M_1$ configured to generate a first audio signal in response to incoming sound at the hearing aid 10. The first audio signal is amplified/buffered and digitized in an input channel 120 for example comprising a microphone preamplifier and analog-to-digital converter 120 (ΣΔ1) to provide a digital microphone signal to an appropriate input port or channel of the control and processing circuit 109. The control and processing circuit 109 may comprise a software programmable DSP core and be adapted to applying one or more signal processing functions to the digital microphone signal under control of a set of executable program instructions or code. The one or more signal processing functions are preferably adapted to process the digital microphone signal according to a hearing loss of a user of the hearing aid 10 such that an appropriately compensated microphone signal is supplied to the user or patient via the miniature loudspeaker 119. These signal processing functions may comprise different processing parameters of functions like non-linear amplification, noise reduction, frequency response shaping etc. Hence, various processing parameters of the one or more signal processing functions may have been determined during a preceding hearing aid fitting session with the user at an audiologist office and loaded into a non-volatile data memory space of the DSP. The control and processing circuit 109 is clocked by a master clock signal supplied by a master/system clock generator 115 and the clock frequency may lie above 2 MHz for example between 2 and 40 MHz. The switched capacitor DC-DC converter 100 may be clocked by a clock signal 117 supplied by the control and processing circuit 109 and possibly derived from the master/system clock generator 115 for example by division of a master clock frequency. Hence, the charge pump circuit of the switched capacitor DC-DC converter 100 is switched in accordance with the clock signal 117 for example by deriving appropriate non-overlapping clock phases from the clock signal as discussed below.

The hearing aid 10 additionally comprises a magnetic inductance antenna 105 for receipt of wireless data signals through a wireless communication channel or link. The wireless communication channel may form part of an ear-to-ear communication link of a binaural hearing aid system allowing digital data signals and digital audio signals to be exchanged between the present hearing aid 10 and another hearing aid (not shown) mounted at or in the user's opposite ear. The magnetic inductance antenna 105 is tuned to a resonance frequency, i.e. exhibiting a predetermined resonance period, set by an LC time constant formed by an inductance component $L_{ant}$ and a capacitance component $C_{ant}$ of the magnetic inductance antenna 105. The inductance component $L_{ant}$ may be provided by a coil or inductor. The magnetic inductance antenna 105 may be tuned to a resonance frequency between 5 and 20 MHz depending on requirement of the particular application in question. The Q factor of the magnetic inductance antenna 105 may be determined by a resistance arranged in series or parallel with the inductance component $L_{ant}$ and/or capacitance component $C_{ant}$ either as a parasitic circuit resistance (e.g. resistance of windings of the coil of $L_{ant}$ or as a separate resistor. The Q factor may for example lie between 10 and 50 such as between 16 and 32. It is generally desirable to design the magnetic inductance antenna 105 with a relatively large Q factor to suppress out-of-band electromagnetic noise of the environment in the antenna signal. The magnetic inductance antenna 105 is coupled to a wireless receiver and decoder 104 for decoding of the wireless data signals received through the communication link. The wireless data signals may comprise a second audio signal that coupled into the control and processing circuit 109 as an alternative audio input path, or as supplementary audio path, to the first audio signal delivered by the microphone M1.

However, the magnetic inductance antenna 105 is sensitive to electromagnetic switching noise emitted by the switched capacitor DC-DC converter 100 during its operation. The electromagnetic switching noise is, for example, caused by output or charging current pulses of the charging current $I_{out}$ flowing through the flying capacitor $C_{fly}$ and its associated pads and wiring and charging current flowing through the output/smoothing capacitor $C_{out}$. The coupling of electromagnetic switching noise from the charging current $I_{out}$ to the magnetic inductance antenna 105 is schematically illustrated by the magnetic coupling arrow 108. This noise sensitivity of the magnetic inductance antenna 105 is often augmented by a relatively close proximity of the switching frequency of the charge pump circuit and the resonance frequency or period of the magnetic inductance antenna 105. The switching frequency of the DC-DC converter 100 may typically be placed somewhere in a range between 250 kHz and 4 MHz such as between 500 kHz and 2.0 MHz which may be optimal to minimize power consumption of the DC-DC converter. The resonance frequency of the magnetic inductance antenna 105 may be situated between 10 MHz and 50 MHz such as at 20 MHz. The pulsed nature of the output or charging current $I_{out}$ which comprises multiple pairs of charging current pulses each pulse possessing a large dI/dt ratio spreads frequency components of the emitted switching noise across the resonance frequency range or period of the magnetic inductance antenna 105. Therefore, interfering with, and disturbing, reception of the desired wireless data signals over the magnetic inductance antenna 105. In some embodiments, the level of switching noise induced in the antenna signal of the magnetic inductance antenna 105 is reduced by adjusting the mutual delay time between the individual output currents pulses of each pair of the output current pulses of the charge pump circuit as discussed in further detail below.

Figure 2:
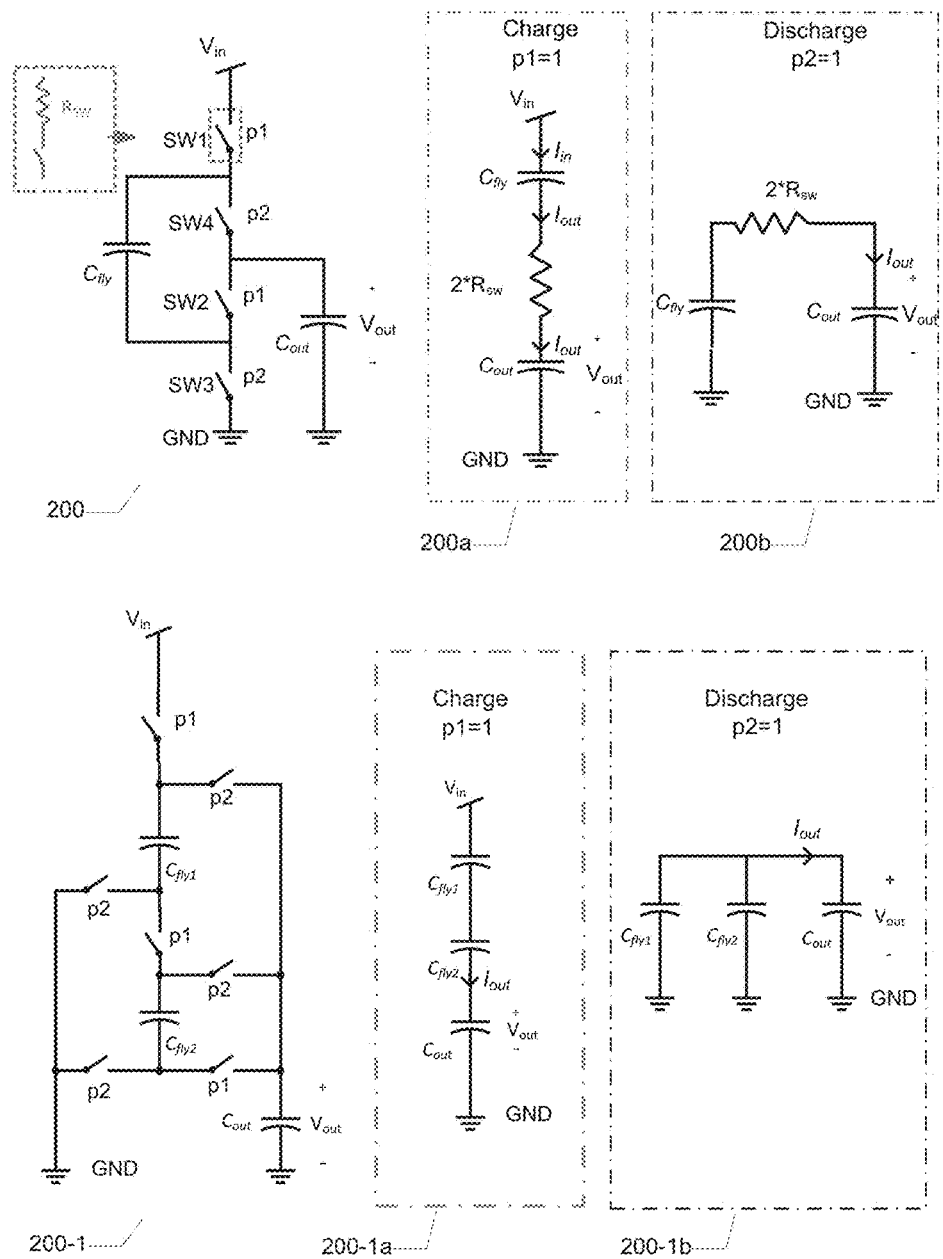
FIG. 2 shows simplified schematic block diagrams of first and second exemplary charge pump circuits for the exemplary switched capacitor DC-DC converter according to some embodiments, FIG. 3A) illustrates a generally applicable electrical model of a switched capacitor DC-DC converter, FIG. 3B) shows a model of a loss resistance $R_{eq}$ of an exemplary charge pump circuit comprising a plurality of multi-segmented semiconductor switches.

The topmost section of FIG. 2 shows a simplified schematic block diagram of a first exemplary charge pump circuit 200 of the previously discussed switched capacitor DC-DC converter 100 in accordance with a first embodiment. The exemplary switched capacitor DC-DC converter has a step-down topology for converting the DC input voltage $V_{in}$ into a DC output voltage $V_{out}$ of approximately one-half of the DC input voltage. The charge pump circuit 200 comprises the previously discussed internal, or external, flying capacitor $C_{fly}$, the output/smoothing capacitor $C_{out}$ and a switch array including a first controllable semiconductor switch SW1, a second controllable semiconductor switch SW2, a third controllable semiconductor switch SW3 and a fourth controllable semiconductor switch SW4. Switches SW1 and SW2 are driven by a first clock phase p1 derived from the previously discussed clock signal applied to the switched capacitor DC-DC converter 100 and switches SW3 and SW4 are driven by a second clock phase p2 derived from the clock signal as schematically illustrated on the drawing. The first and second clock phases p1 and p2 are complementary and non-overlapping. The DC input voltage $V_{in}$ for the charge pump circuit 200 is applied to an input of the switch SW1 and the DC output voltage $V_{out}$ is delivered at output/smoothing capacitor $C_{out}$. A load (not shown) of the charge pump circuit 200 may be connected across the output/smoothing capacitor $C_{out}$ and the skilled person will understand the latter supplies energy to the load during both the charge state and discharge state of the charge pump circuit as shown on state diagrams 200a, 200b. In the state diagram 200a, the flying capacitor $C_{fly}$ is charged from, or by, the DC input voltage and the output capacitor $C_{out}$ likewise charged from the DC input voltage.

The skilled person will appreciate that each of the controllable semiconductor switches SW1, SW2, SW3 and SW4 may comprise one or several paralleled MOSFET(s), e.g. NMOS transistor(s) or PMOS transistor(s), or a combination of MOSFETs, as the small size, large off-resistance and low on-resistance of MOSFET switches are advantageous properties in numerous applications of the charge pump circuit 200.

In the present step-down topology of the charge pump circuit 200, SW1 is connected between the DC input voltage and a positive terminal of the flying capacitor; SW2 is connected between a negative terminal of the flying capacitor and the DC output voltage. In an alternative 1:2 step-up embodiment, SW2 is connected between the negative terminal of the flying capacitor and a negative DC supply rail, such as GND. SW3 is connected between the negative terminal of the flying capacitor and the negative DC supply rail—e.g. GND. In the alternative 1:2 step-up embodiment, SW3 is connected between the negative terminal of the flying capacitor and the DC input voltage. SW4 is connected between the positive terminal of the flying capacitor and the DC output voltage. During operation of the charge pump circuit 200, the first and second switches SW1, SW2 are switched between respective on-states and off-states in accordance with the first clock phase p1 and the third and fourth switches SW3, SW4 are switched between respective on-states and off-states in accordance with the second clock phase p2. Hence, the switch array is configured to, in or during the first clock phase, charge the flying capacitor $C_{fly}$ from the DC input voltage $V_{in}$ through the on-resistances of SW1 and SW2. The combined on-resistance of SW1 and SW2 is schematically represented by resistor $2*R_{SW}$. Furthermore, during the first clock phase, the switches SW3 and SW4 are off or non-conducting or off which lead to the equivalent schematic circuit diagram 200a. As illustrated, the flying capacitor $C_{fly}$ and output capacitor $C_{out}$ are effectively connected in series between the DC input voltage $V_{in}$ and GND. In this manner the output capacitor is charged by the output current pulses of $I_{out}$ to approximately one-half of the DC input voltage by periodically switching between the first and second clock phases in steady state operation when the load current from the DC output voltage of the charge pump circuit 200 is zero. The flying capacitor $C_{fly}$ is simultaneously charged by the input current $I_{in}$ supplied by the DC input voltage $V_{in}$ through SW1 by similar input current pulses. The switch array is configured to discharge the flying capacitor $C_{fly}$ into the output capacitor $C_{out}$ during the second clock phase p2 using a charge sharing mechanism due to the parallel connection of the flying capacitor and output capacitor by the output current pulses of $I_{out}$ flowing through the on-resistances of the conducting switches SW3 and SW4. During the second clock phase, the switches SW1 and SW2 are off, i.e. or non-conducting, which leads to the equivalent schematic circuit diagram 200b. As illustrated, the flying capacitor $C_{fly}$ and output capacitor $C_{out}$ are effectively connected in parallel and disconnected from the DC input voltage Vi. However, the output current $I_{out}$ is now flowing through the on-resistances of the conducting switches SW3 and SW4. The skilled person will appreciate that each of the controllable semiconductor switches SW1, SW2, SW3 and SW4 may comprises a control terminal (not shown), e.g. a gate terminal for MOSFETs, to which the first or second clock phases p1, p2 are applied to selectively switch the controllable semiconductor switch in question between its on-state and off-state.

The bottom section of FIG. 2 shows a simplified schematic block diagram of a first exemplary charge pump circuit 200-1 of the previously discussed switched capacitor DC-DC converter 100 in accordance with a second embodiment. The present embodiment of the switched capacitor DC-DC converter 200-1 possesses a 3:1 step-down topology configured for converting the DC input voltage $V_{in}$ into a DC output voltage $V_{out}$ of approximately one-third of the DC input voltage. The present charge pump circuit 200-1 comprises, in contrast to the previously discussed pump circuit 200, two separate flying capacitors—a first flying capacitor $C_{fly1}$ and a second flying capacitor $C_{fly2}$. The charge pump circuit 200-1 comprises additionally an output/smoothing capacitor $C_{out}$ and a switch array including a total of seven controllable semiconductor switches controlled by respective clock phases of the first and second non-overlapping clock phases p1, p2 as illustrated. During operation of the charge pump circuit 200-1, the switch array, comprising a total of seven controllable semiconductor switches, is configured to, in or during the first clock phase, simultaneously charge the first flying capacitor $C_{fly1}$ and second flying capacitor $C_{fly2}$ from the DC input voltage $V_{in}$ through the on-resistances of active switches. Furthermore, during the first clock phase, the switches operated by the second clock phase p2 are off or non-conducting which leads to the equivalent schematic circuit diagram 200-1a. As illustrated, the first and second flying capacitors and the output capacitor $C_{out}$ are effectively connected in series between the DC input voltage $V_{in}$ and GND, or another negative supply rail, such that the output voltage is charged to approximately one-third of the DC input voltage in steady state operation of the pump circuit for the reasons discussed above in connection with the first charge pump circuit 200. The switch array is configured to, during the second clock phase p2, discharge the first and second flying capacitors into the output capacitor $C_{out}$ through a charge sharing mechanism caused by the parallel connection of the first and second flying capacitors and the output capacitor through the respective on-resistances of the active/conducting switches of the switch array. During the second clock phase, the switches operated by the first clock phase p1 are off or non-conducting while the switches operated by the second clock phase p2 are on or conducting which lead to the equivalent schematic circuit diagram 200-1b of the charge pump circuit 200-1. As illustrated, the first and second flying capacitors $C_{fly1}$ and $C_{fly2}$ and the output capacitor $C_{out}$ are effectively connected in parallel and disconnected from the DC input voltage $V_{in}$.

Figure 3A:
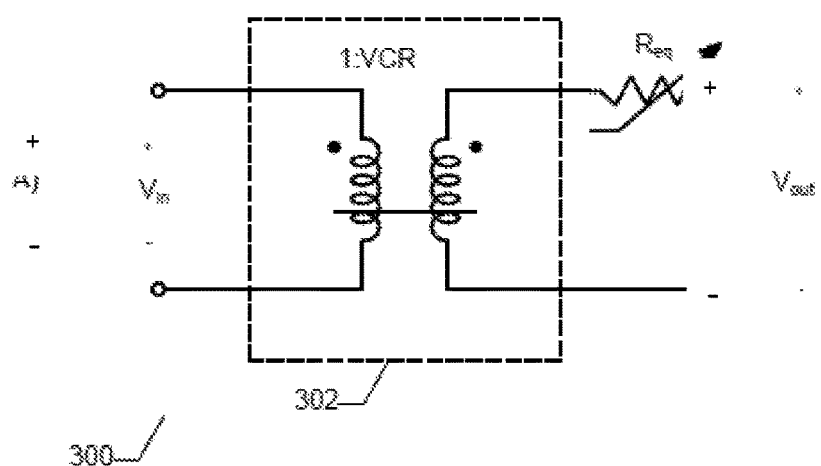

FIG. 3A) shows a generally applicable model 300 of a switched capacitor DC-DC converter which model is discussed below to highlight some of the properties of the switched capacitor DC-DC converter in accordance with some embodiments. The DC input voltage $V_{in}$ feeds input power or energy to switched capacitor DC-DC converter and during operation the latter generates the DC output voltage $V_{out}$ which may be higher or lower than the DC input voltage depending on the topology of the switched capacitor DC-DC converter as discussed above. The switched capacitor DC-DC converter is particularly efficient when the nominal DC input voltage and DC output voltage are related by an certain ratio, illustrated by VCR, such as ⅓ or ½ or ⅔ or 2, or 3 or 5 etc. Hence, the model 300 of the switched capacitor DC-DC converter comprises an ideal transformer 302 with a variable winding ratio as set by the VCR and an equivalent loss resistance $R_{eq}$ connected in series with a secondary winding of the transformer 302.

The loss resistance $R_{eq}$ comprises two separate resistance components: 1) a first resistance component representing an equivalent output resistance associated with switching of the one or more flying capacitors at the clock frequency of the clock signal driving the first and second clock phases. The skilled person will understand that this equivalent output resistance is inversely proportional to the clock frequency such that increasing clock frequency leads to decreasing equivalent output resistance; and 2) a second resistance component representing the combined on-resistance of the active semiconductor switches in any particular clock phase, e.g. on-resistances of the switches SW1 and SW2 in the first clock phase p1 of the previously discussed exemplary 2:1 step-down charge pump circuit 200.

The latter resistance component 2) is mainly determined by the size of the semiconductor switch in question, the semiconductor process technology and level of the applied control voltage. However, in certain embodiments, each, or at least a subset, of the controllable semiconductor switches of the switch matrix of the charge pump circuit is formed by a two or more individually controllable switch segments such that a suitable control device and mechanism may activate different subsets of the individually controllable switch segments with time delays in connection with activation/turn-on of the corresponding semiconductor switch.

Figure 3B:
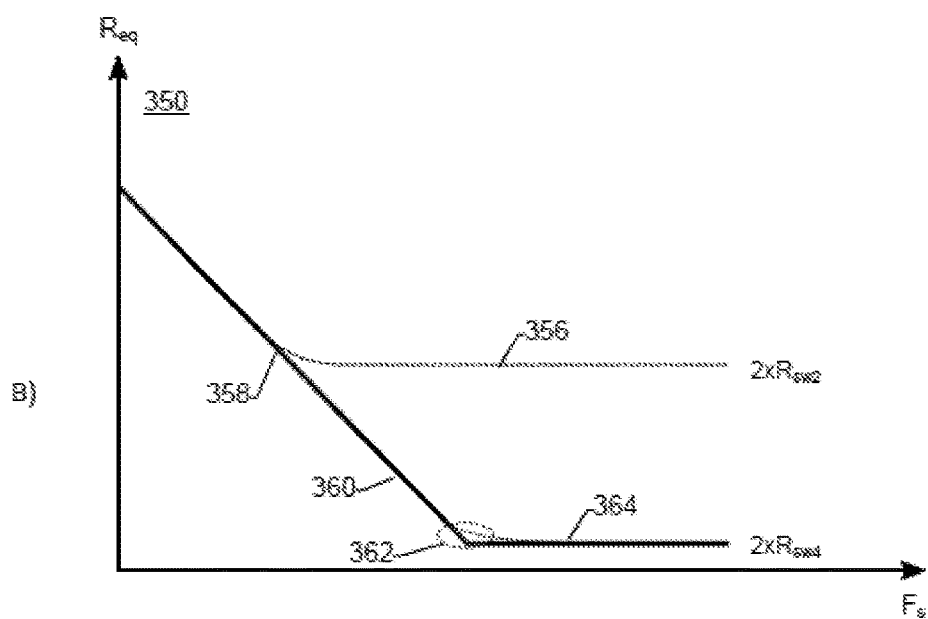

Graph 350 of FIG. 3B) illustrates how the loss resistance $R_{eq}$ of a two segment semiconductor switch comprises two separate resistance components that are individually controllable. The y-axis shows the loss resistance $R_{eq}$ on an arbitrary logarithmic scale and the x-axis depicts the clock frequency $F_S$ of the clock signal on a logarithmic scale. The clock frequency $F_S$ is equal to a switching frequency of the flying capacitor as set by the first and second clock phases. The loss resistance $R_{eq}$ plots 356 and 364 of graph 350 illustrate the resistance of the two segment switch.

Hence, the on-resistance, and the equivalent conductance, of a particular controllable semiconductor switch in the present embodiment is controllable in two steps by activating a single switch segment or both switch segments via an appropriate set of segment phases or switch segment control signals applied to the respective controls terminals, e.g. gate terminals, of the two switch segments. Plot 358 shows the asymptotic approximation of the loss resistance $R_{eq}$ versus clock frequency $F_S$ when both switch segments of the semiconductor switch are activated, or conducting. The asymptotic plot 358 comprises two essentially straight portions where the first plot portion 360 shows the loss resistance $R_{eq}$ where the latter is dominated by the first resistance component representing the equivalent output resistance associated with the switching of the flying capacitor. As expected, the loss resistance $R_{eq}$ is inversely proportional to the clock frequency $F_S$ in the first plot portion 360. The second plot portion 364 shows the asymptote of the loss resistance $R_{eq}$ when dominated by the second resistance component representing the combined on-resistance of the two parallelly connected switch segments of the semiconductor switch. As expected, the loss resistance $R_{eq}$ is substantially constant independent of the clock frequency $F_S$ along the portion 364 because of the diminishing resistance of the first resistance component. Finally, the knee-point 362 shows the clock frequency $F_S$ where the first and second resistance components of loss resistance $R_{eq}$ are essentially equal. The loss resistance plot 356 illustrates schematically the effect of a single conducting switch segment of the semiconductor switch. As expected, the loss resistance $R_{eq}$ of the semiconductor switch increases progressively with merely one conducting switch segment at higher clock or switching frequencies $F_S$ because of the dominating influence of the second resistance component of the loss resistance $R_{eq}$. Furthermore, the loss resistance $R_{eq}$ of the semiconductor switch remains largely independent of the number of active switch segments at very small clock or switching frequencies $F_S$ because of the now dominating influence of the first resistance component of the loss resistance $R_{eq}$.

Figure 4:
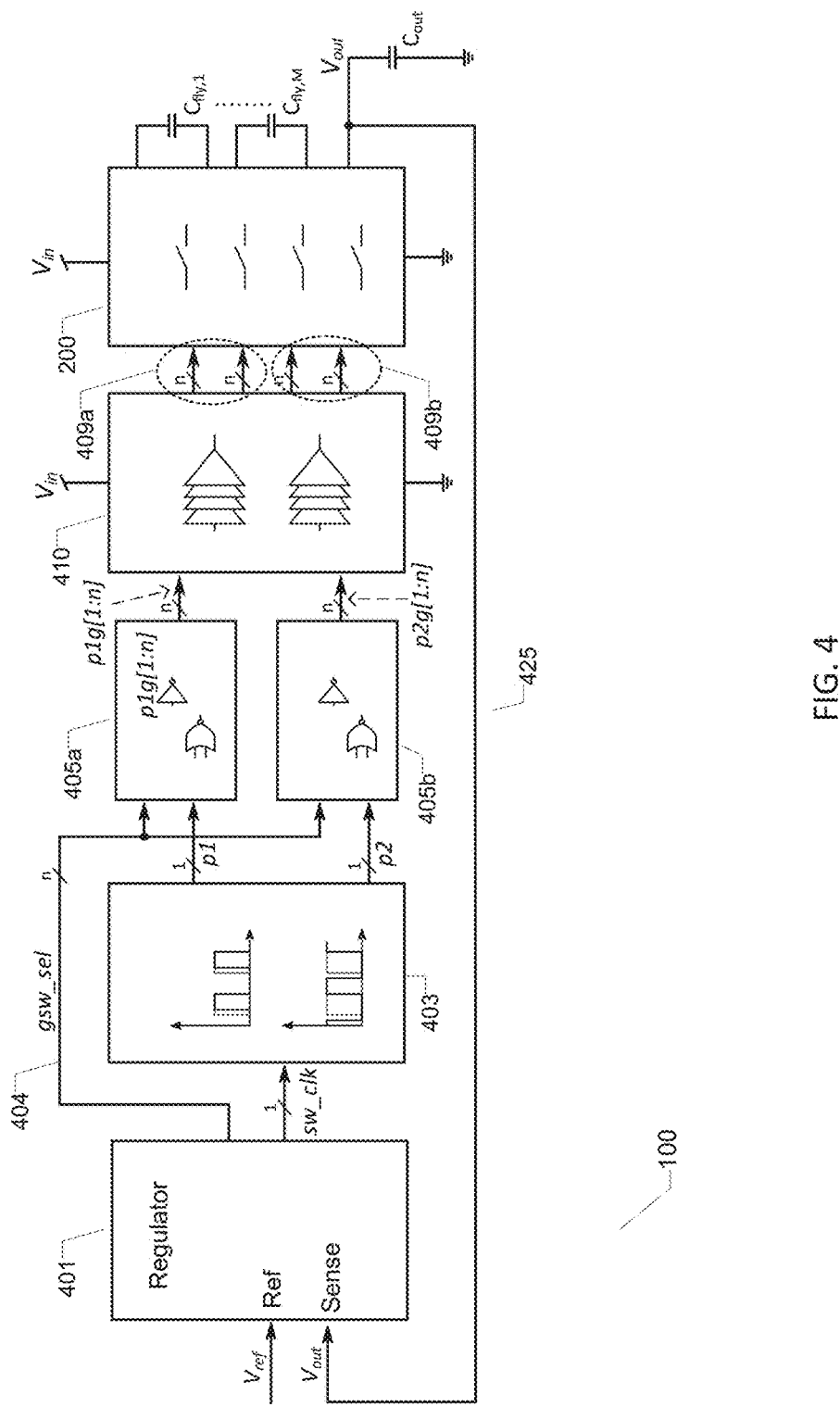
FIG. 4 shows a block diagram of an exemplary switched capacitor (SC) DC-DC converter in accordance with some embodiments.

FIG. 4 is a simplified schematic block diagram of the previously discussed switched capacitor (SC) DC-DC converter 100 in accordance with various exemplary embodiments. The SC DC-DC converter 100 may for example be configured to convert the DC input voltage $V_{in}$ into a DC output voltage $V_{out}$ of approximately one-half of the DC input voltage, i.e. 2:1 step-down, by using merely a single one of the illustrated flying capacitors $C_{fly1}$ and $C_{fly2}$ and thus arrive at the embodiment depicted on FIG. 1. The skilled person will understand that the DC supply voltage to the charge pump circuit 200, and possibly for a gate driver 410, in the latter embodiments may be derived from the higher DC output voltage $V_{out}$ to provide adequately large voltage for the control terminals of the controllable semiconductor switches of the charge pump circuit 200. The skilled person will appreciate that the drawing shows merely four separate first and second complementary and non-overlapping clock phases inputted to the charge pump circuit 200. The use of four separate first and second complementary and non-overlapping clock phases is suitable configuration to drive four segmented controllable semiconductor switches SW1, SW2, SW3 and SW4 of the 2:1 step-down SC converter discussed above with reference to FIGS. 1-3. However, alternative embodiments may comprise additional clock phase signals to drive additional controllable semiconductor switches as indicated previously in connection with the description of the charge pump circuit 200-1 of FIG. 2. In both cases the four, seven or even larger number of controllable semiconductor switches form a switch array which is driven by the first and second non-overlapping clock phases such that the charge pump circuit alternatingly charges least one of the first and second flying capacitors and the output capacitor $C_{out}$ by the DC input voltage during the first clock phase and discharges the charged flying capacitor into the output capacitor $C_{out}$ during the second clock phase. Hence, charging the output capacitor and increasing the DC output voltage. The skilled person will additionally understand that some embodiments of the charge pump circuit 100 may comprise a so-called "gearbox" combining two or more different converter topologies in combination with a topology switching scheme. One such multi-topology embodiment of the charge pump circuit 100 may comprise a 2:1 step-down SC converter and a 3:1 step-down SC converter where the digital switch array controller is configured to select between the 2:1 step-down SC converter and 3:1 step-down SC converter depending on a voltage difference between the DC input voltage $V_{in}$ and the DC output voltage $V_{out}$. This feature may be advantageous to optimize the power conversion efficiency of the charge pump circuit 200 at varying levels of the DC input voltage $V_{in}$—for example caused by different charging states of the previously discussed rechargeable battery source supplying the DC input voltage to the SC DC-DC converter 100.

The SC DC-DC converter 100 comprises an output voltage regulator 401. The output voltage regulator 401 determines the clock frequency of the charge pump circuit 200 since the first and second non-overlapping clock phases p1, p2 are derived from the clock signal sw_clk generated by the output voltage regulator 401 via a digital switch array controller as discussed below. The output voltage regulator 401 may comprise a clock generator which is configured to generate the clock signal at a fixed clock frequency or at an adjustable clock frequency. The fixed clock frequency may in certain embodiments correspond to about twice the resonance/tuning frequency of the magnetic inductance antenna.

The frequency of the clock signal may be adjustable or programmable in alternative embodiments of the SC DC-DC converter 100 such that the frequency of the clock signal may be adapted or calibrated to a nominal tuning frequency or a measured tuning frequency of the magnetic inductance antenna. Thus, providing a calibration mechanism for compensating manufacturing variations of the resonance/tuning frequency of the magnetic inductance antenna, e.g. caused by component tolerances of the inductance component $L_{ant}$ and capacitance component $C_{ant}$ of the magnetic inductance antenna.

The regulator 401 may adjust the frequency of the clock signal, often within certain upper and lower bounds, to regulate the DC output voltage via a feedback loop extending from the DC output voltage and back to a first input, Sense, of the output voltage regulator 401 via the feedback wire or conductor 425. The output voltage regulator 401 additionally comprises a DC reference voltage input, Ref, for receipt of a DC reference voltage $V_{ref}$ indicating the desired or target DC output voltage. The feedback loop is operable to minimize a voltage difference or deviation between the DC reference voltage $V_{ref}$ at Ref input and the actual the DC output voltage by adjusting the clock frequency or switching frequency applied to the charge pump circuit 100, via the first and second non-overlapping clock phases p1, p2.

The digital switch array controller may comprise combinational and sequential digital logic, e.g. implemented as a digital state machine, configured to generate the respective sets of control signals for driving the respective switch segments of the four segmented controllable semiconductor switches SW1, SW2, SW3 and SW4. The digital switch array controller comprises a non-overlapping clock generator 403 configured to derive the previously discussed first and second non-overlapping clock signals from the clock signal sw_clk supplied by the output voltage regulator 401. A first switch encoder 405*a* of the digital switch array controller utilizes the first clock phase p1 and a switch select data supplied via a select bus 404 to generate first and second segment phases, respectively, for first and second individually controllable switch segments of the first and second controllable semiconductor switches SW1, SW2 as discussed in additional detail below with reference to FIG. 7. Likewise, the second switch encoder 405*b* utilizes the second clock phase p2 and a switch select data supplied via a select bus 404 to generate first and second segment phases, respectively, for first and second individually controllable switch segments of the third and fourth controllable semiconductor switches SW3, SW4. The digital switch array controller comprises a gate driver block 410 illustrated as a separate circuit for convenience. The gate driver block 410 is configured to generate the required first and second (but generally n) segment phases or segment control signals 409*a* for respective ones of the individually controllable switch segments of each of the first and second controllable semiconductor switches SW1, SW2 in accordance with the first clock phase p1 and likewise generating the n switch segment control signals 409*b* for respective ones of the first and second individually controllable switch segments of each of the third and fourth controllable semiconductor switches SW3, SW4 in accordance with the second clock phase p2. The gate driver block 410 may for example comprise a plurality of digital buffers, a plurality of level shifters or voltage translators for supplying sufficient drive voltage and current to drive the loads presented by the respective control inputs of the individually controllable switch segments. The SC DC-DC converter 100 may include different designs of the output voltage regulator 401 providing different switching schemes for unsegmented or segmented versions of the controllable semiconductor switches of the charge pump circuits 200, 200-1. Different designs and functionalities of the output voltage regulator are disclosed in the applicant's co-pending European patent application No. 16197041.3 which is hereby incorporated in its entirety by reference.

Figure 5:
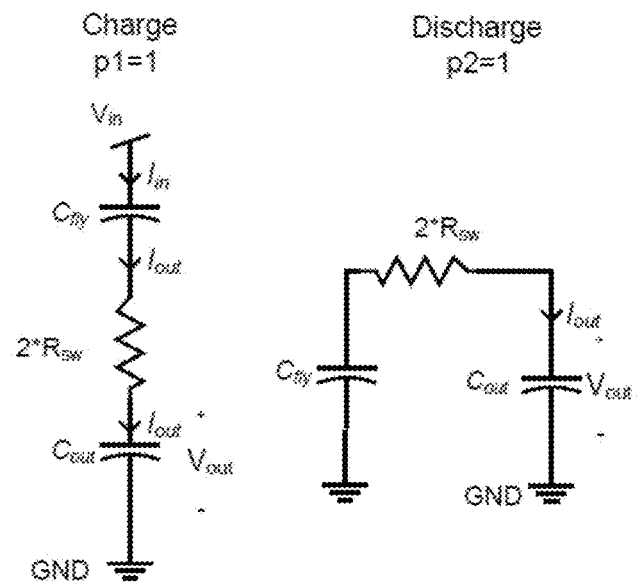
FIG. 5 shows simplified block diagrams of a charge state and a discharge state of an exemplary charge pump circuit and corresponding input and output current pulses.
Figure 5:
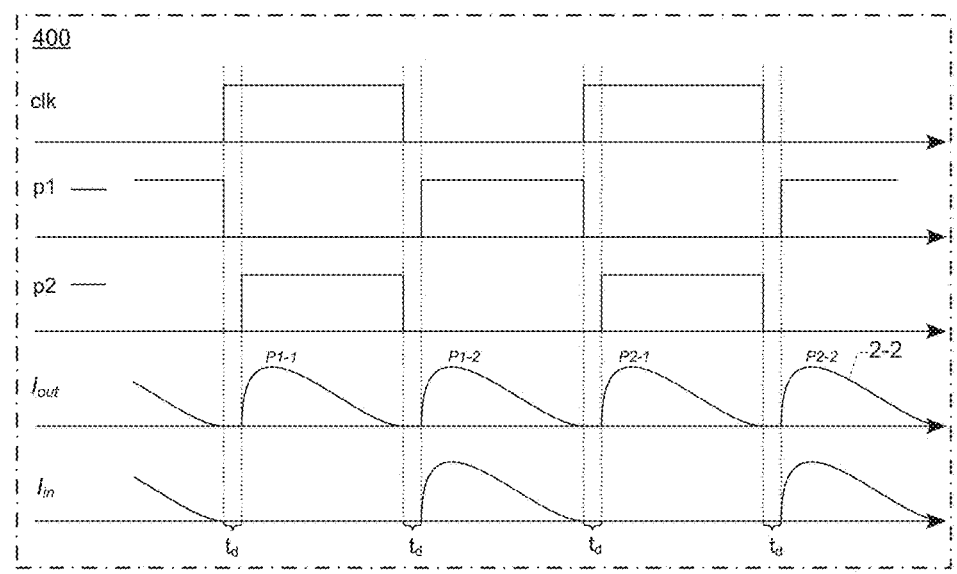

The topmost section of FIG. 5 repeats the previously discussed charge state and discharge state of the exemplary charge pump circuit 200 of the switched capacitor DC-DC converter 100. The lowermost section of FIG. 5 shows a graph 400 of signal waveforms associated by the operation of the exemplary charge pump circuit 200. The uppermost waveform shows the clock signal clk while the lower waveform p1 and p2 show signal waveforms of the first and second clock phases p1 and p2 derived from the clock signal, clk, driving the first and second controllable semiconductor switches SW1, SW2 and the third and fourth controllable semiconductor switches, SW3 and SW4, respectively. The first and second clock phases p1 and p2 are non-overlapping and complementary where the non-overlapping property is caused by the presence of a small dead-time $t_d$ between state transitions of first and second clock phases p1 and p2. The $I_{out}$ waveform shows the output charging current flowing through flying capacitor $C_{fly}$ and the output capacitor. The skilled person will appreciate that the output charging current $I_{out}$ comprises a plurality of output current pulses with a large slew-rate or dI/dt value leading to the emission of the previously discussed broad-spectrum electromagnetic noise from the charge pump circuit. The repetition frequency of the charging current pulses of the charging current $I_{out}$ is twice the frequency of the clock signal clk because one output charging current pulse is generated at the on-state transition of each of the first and second clock phases p1 and p2. On the other hand, the input charging current $I_{in}$ waveform shows that the input current flowing into the flying capacitor $C_{fly}$ from the DC input voltage has the same frequency as the clock signal which is a consequence of the fact that the flying capacitor $C_{fly}$ is disconnected, by the off-state of SW1, from DC input voltage during the discharge state of the charge pump circuit 200. However, the skilled person will appreciate that the charging current $I_{in}$ also comprises a plurality of input charging current pulses each possessing a large slew-rate or dI/dt value which means that these input charging current pulses represent a separate source of electromagnetic disturbance of the signals in the magnetic inductance antenna 105. The mutual time delay between first and second consecutive output current pulses, such as p1-1 and p1-2, of the output current pulses is preferably set substantially equal to one-half of the predetermined resonance period of the magnetic inductance antenna to achieve the desired suppression of electromagnetic noise disturbances in the magnetic inductance antenna caused by the switching operation of the switched capacitor DC-DC converter as discussed in additional detail below. The same mutual time delay is set between the third and fourth consecutive output current pulses p2-1, p2-2 and so forth for all subsequent pairs or sets of the output current pulses.

Figure 6:
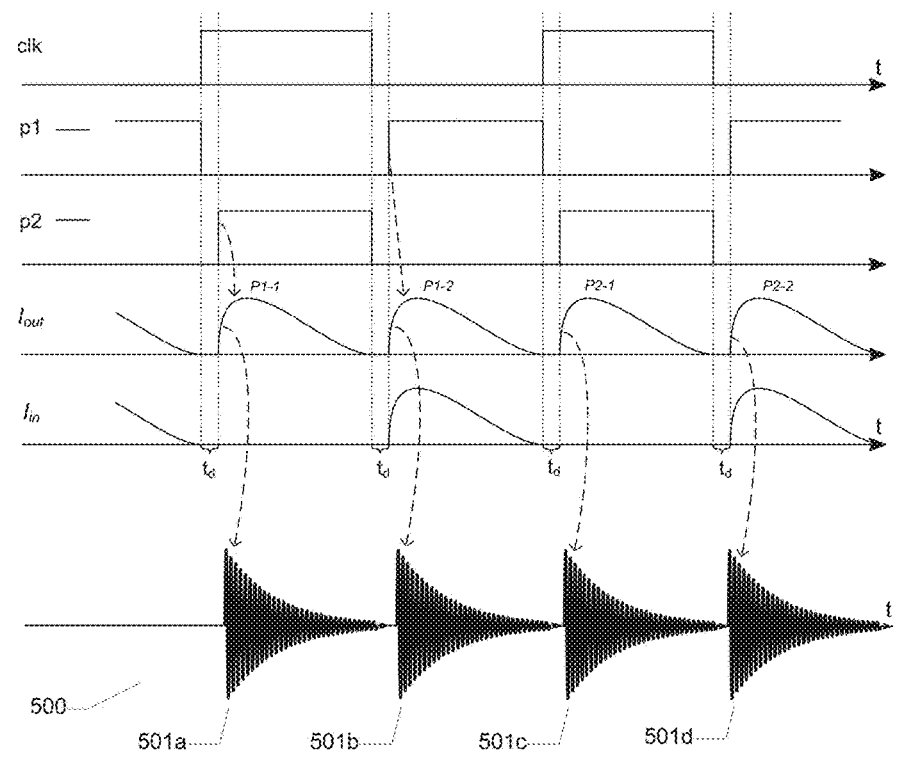
FIG. 6 illustrates schematically noise or disturbance signals induced in the magnetic inductance antenna by the output charging current pulses flowing in the charge pump circuit of the exemplary switched capacitor DC-DC converter.

The topmost section of FIG. 6 shows signal waveforms associated with the operation of the exemplary charge pump circuits 200, 200-1 as depicted on graph 400. The antenna signal waveform 500 shows the electromagnetic noise signal or disturbance induced in the magnetic inductance antenna 105, i.e. the antenna noise signal, caused by the output charging current pulses of the charging current $I_{out}$ and hence superimposed onto the desired wireless data signal.

For the present simulation, the repetition frequency of the charging current pulses is markedly smaller than the tuning frequency of the magnetic inductance antenna 105—for example 10 times smaller. Each on-set of an output charging current pulse, in response to the on-transition of one of the switch phases p1, p2, leads to the generation of a prolonged underdamped sinusoidal ringing pulse 501a-501d in the antenna noise signal, i.e. a switching noise pulse. The switching noise pulse is oscillating at the resonant frequency of the antenna. The pronounced ringing and large amplitude of the switching noise pulse are caused by the high Q value of the magnetic inductance antenna 105. By reducing the inter-pulse time delay between a pair of consecutive output charging current pulses down to about one-half of the predetermined resonance period of the magnetic inductance antenna in accordance with some embodiments, the desired suppression of electromagnetic noise disturbances of the magnetic inductance antenna is achieved. However, in certain applications it may be impractical to reduce this inter-pulse time delay to the required relatively short time period, because the inter-pulse time delay implies a corresponding high switching frequency of the switched capacitor DC-DC converter 100, e.g. 10 MHz switching frequency for a 10 MHz tuning frequency of magnetic inductance antenna. Such a high switching frequency of the switched capacitor DC-DC converter 100 may lead to unacceptable power consumption in some embodiments of the switched capacitor DC-DC converter.

Figure 7:
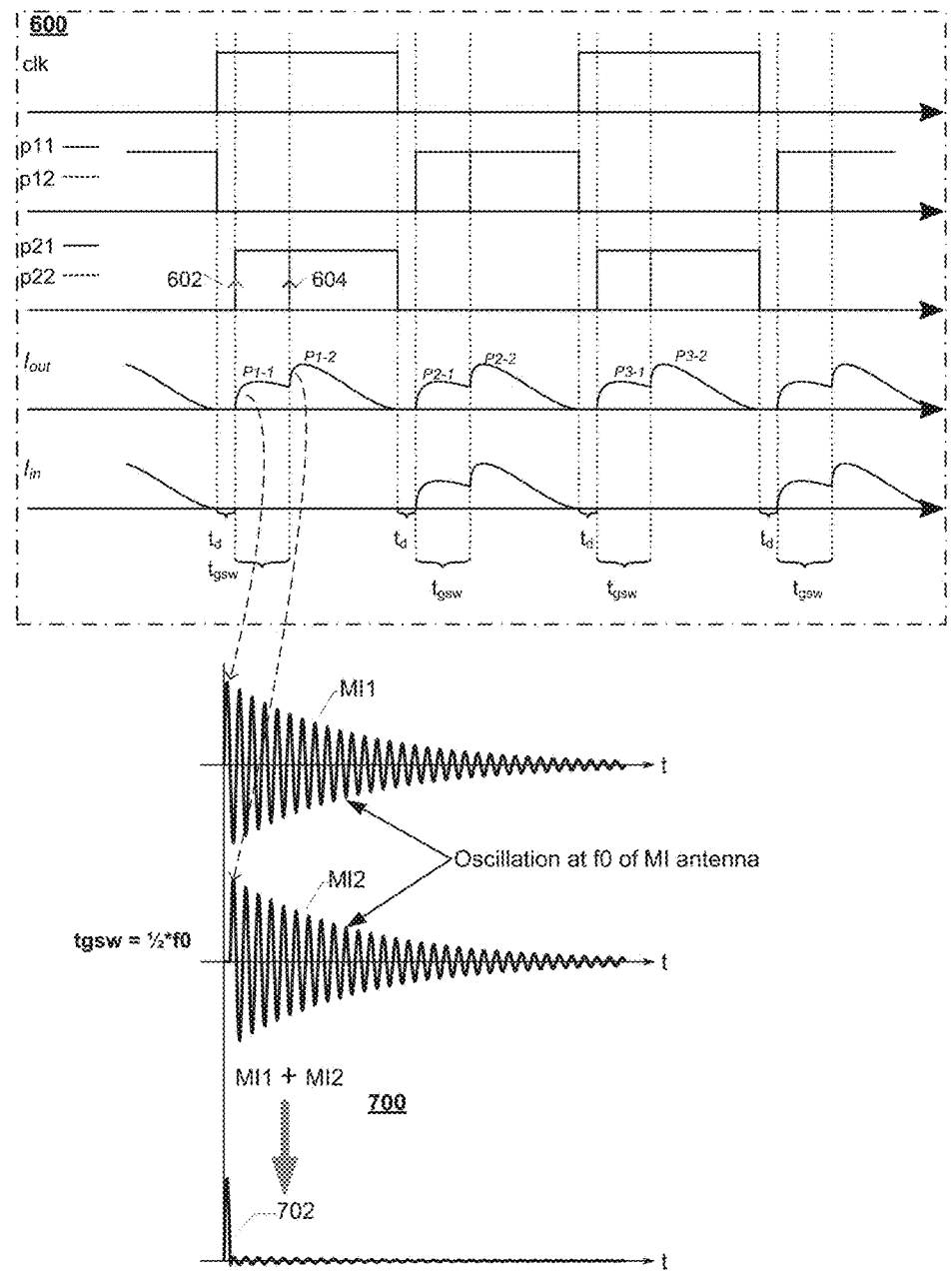
FIG. 7 illustrates various signal waveforms associated with the operation of the charge pump circuit and how suppression of the noise or disturbance signals induced in the magnetic inductance antenna by the output current pulses is achieved in accordance with some embodiments.

The topmost section of FIG. 7 shows signal waveforms associated with the operation of the exemplary charge pump circuits 200, 200-1 in accordance with a second embodiment of the switched capacitor DC-DC converter 100. In the present embodiment, the frequency of the clock signal, clk—the uppermost waveform of graph 600, driving the charge pump circuit is typically much lower than one-half of the predetermined resonance period of the magnetic inductance antenna—for example between 5 and 20 times smaller. The frequency of the clock signal may lie between 250 kHz and 4 MHz. The power consumption of the charge pump circuit decreases by using a relatively low frequency of the clock signal clk. The clock waveforms p11 and p21 are first and second non-overlapping clock phases derived from the clock signal, clk. The intra-phase delay time $t_d$ ensures that the clock phases are non-overlapping to prevent the generation of cross-bar currents between the positive and negative DC supply voltages. Each of the previously discussed controllable semiconductor switches SW1, SW2, SW3 and SW4 is divided into two separate individually controllable first and second switch segments controlled by respective segment phases such that each of the semiconductor switches SW1, SW2, SW3 and SW4 is turned-on in a step wise manner by first turning-on the first segment and then additionally turn-on the second switch with a well-controlled time delay. This delayed turn-on or activation of the first and second switch segments leads is illustrated on waveform graph 600 where p21, p22 shows the third and fourth segment phases, respectively, derived from the second clock phase, that are applied to the respective control terminals of the first and second switch segments of the third and fourth semiconductor switches SW3 and SW4. As illustrated by the charging current $I_{out}$ waveform multiple pairs of consecutive output current pulses p1-2; p1-2; p2-1, p2-2; p3-1, p3-2 etc., are generated by the charge pump circuit during operation in accordance with the clock signal, clk. A first output current pulse p1-1 of the first pair is generated in response to the turn-on of the first switch segments of SW3 and SW4. The first switch segments of SW3 and SW4 are turned-on at the on-state transition 602, i.e. rising edge, of the third segment phase p21 and this action partially charges the flying capacitor and output capacitor through the respective on-resistances of the first switch segments of SW3 and SW4 of the charge pump circuit as discussed before. The second switch segments of SW3 and SW4 are turned on at the on-state transition 604 of the fourth segment phase p21. The on-state transition 604 of the fourth segment phase p22 is delayed relative to on-set of the third segment phase 602 by the mutual pulse delay $t_{gsw}$ which is about one-half of the predetermined resonance period of the magnetic inductance antenna, i.e. the mutual pulse delay $t_{gsw}$, or inter-pulse time delay, is approximately 50 ns for a 10 MHz tuning frequency of magnetic inductance antenna and so forth. The on-state transition 604 of the fourth segment phase p22 switches the second switch segments of SW3 and SW4 to respective on-states such the respective switch resistances are reduced, assuming that the first and second switch segments are arranged in parallel. This action leads to the generation of a second output current pulse p2-1 of the output current pulses. The second output current pulse p2-1 supplies additional electric charge to the output capacitor to increase its charge and voltage.

First and second output current pulses p2-1, p2-2 of the subsequent set of output current pulses are generated in a corresponding manner response to the turn-on of the first switch segments of SW1 and SW2 as controlled by the on-state transition of the first segment phase p11 and the delayed turn-on of the second switch segments of SW1 and SW2 as controlled by the delayed on-state transition of the second segment phase p12. This action partially charges the flying capacitor and output capacitor through the respective on-resistances of the first switch segments of SW3 and SW4 of the charge pump circuit as discussed before. The second switch segments of SW3 and SW4 are turned on at the on-state transition 604 of the fourth segment phase p21. The skilled person will understand that the on-state transition of the second segment phase p12 is delayed relative to on-set of the first segment phase by the mutual pulse delay $t_{gsw}$ which is about one-half of the predetermined resonance period of the magnetic inductance antenna. The operation of the charge pump circuit thereafter repeats to generate the plurality of pairs of consecutive output current pulses p1-2; p1-2; p2-1, p2-2; p3-1, p3-2 etc. Therefore, the skilled person will understand that first and second consecutive output current pulses are generated during each of the first and second clocks phases in the current embodiment such that a fundamental frequency of the output or charging current pulses is twice the frequency of the clock signal.

The first switching noise pulse or disturbance MI1 is induced in the magnetic inductance antenna by the first output charging current pulse p1-1 and the second switching noise pulse or disturbance MI2 is induced in the magnetic inductance antenna by the second output charging current pulse p1-2 for the reasons discussed. The mutual pulse delay $t_{gsw}$ between the first and second consecutive output current pulses is selected to about one-half of the predetermined resonance period of the magnetic inductance antenna which means that the switching noise pulses MI1 and MI2 are approximately 180 degrees out of phase and therefore tend to at least partly cancel by superposition of the signals to achieve the desired suppression of electromagnetic noise disturbance of the magnetic inductance antenna. This mechanism is illustrated on graph 700 which shows the resulting, summed, voltage of the switching noise pulse 702 induced in the magnetic inductance antenna 105. The resulting switching noise pulse 702 merely contains a small transient when the first switch segments of SW3 and SW4 are turned-on at the on-state transition 602 and corresponding small noise transient (not shown) at the subsequent transitions of the segment phases p11, p21.

The skilled person will appreciate that the most effective suppression of the switching noise pulses in the magnetic inductance antenna may occur when the first and second consecutive output charging current pulse p1-1, p-1-2, etc. possess substantially identical waveform shapes including peak current values, i.e. the first and second consecutive output current pulses p1-1, p-1-2 are essentially delayed replica of each other. This may be achieved by appropriately scaling the on-resistances of the first and second switch segments of each of the previously discussed controllable semiconductor switches SW1, SW2, SW3 and SW4. In some embodiments, the on-resistances of the first and second switch segments may be substantially identical while the on-resistances of the first and second switch segments may differ in other embodiments. The optimum, or at least near-optimum, scaling of the on-resistances of the first and second switch segments may be experimentally determined where level of the switching noise pulses in the magnetic inductance antenna is directly measured or monitored during operation of the head-wearable hearing device and switched capacitor DC-DC converter, while the on-resistances of the first and second switch segments of the controllable semiconductor switches SW1, SW2, SW3 and SW4 are varied in a suitable manner until a minimum level of the switching noise signal in the magnetic inductance antenna is reached. This procedure takes direct approach to finding the relationship between the magnetic noise emissions associated with the consecutive output or charging current pulses and the switching noise pulses induced in the magnetic inductance antenna. The physical coupling mechanisms may be difficult to estimate or compute theoretically, because of the interaction of electromagnetic fields, physical dimensions and orientation of the relevant conductive paths and elements of the switched capacitor DC-DC converter and the magnetic inductance antenna.

The skilled person will understand that the switched capacitor DC-DC converter may comprise a digital switch array controller which comprises combinational and sequential digital logic, e.g. implemented as a digital state machine, configured to generate the above-mentioned first and second clock phases, switch segment phases and other control signals at appropriate timings for driving the respective switch segments of the four segmented controllable semiconductor switches SW1, SW2, SW3 and SW4 of the charge pump circuit.

In other embodiments of the switched capacitor DC-DC converter, the mutual pulse delay $t_{gsw}$ between the first and second consecutive output current pulses may be set to approximately 1.5 times, 2.5 times, or even 3.5 times and so on of the resonance period of the magnetic inductance antenna and still achieve a marked suppression of the electromagnetic noise disturbance of the magnetic inductance antenna so forth.

Figure 8:
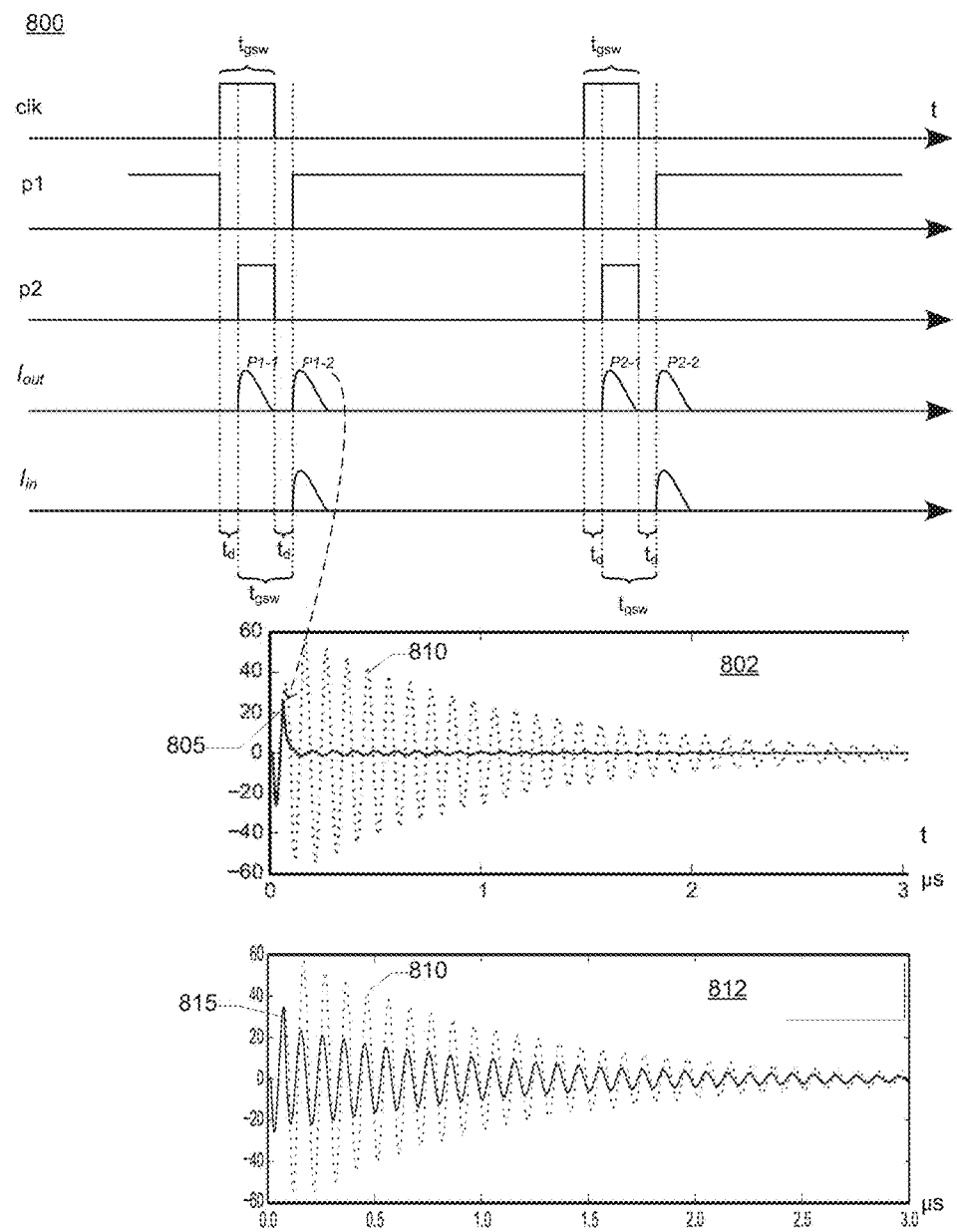
FIG. 8 illustrates various signal waveforms associated with the operation of the charge pump circuit and corresponding electromagnetic noise signals induced in the magnetic inductance antenna by the output charging current pulses of a prior art SC DC-DC converter and a SC DC-DC converter embodiment.

FIG. 8 shows a graph 800 comprising various signal waveforms associated with the operation of the exemplary charge pump circuits 200, 200-1 in accordance with a third embodiment of the switched capacitor DC-DC converter 100. The output voltage regulator of the present SC DC-DC converter applies a so-called pulse-skipping mechanism to achieve regulation of the DC output voltage of the converter which means that the time span between consecutive clock pulses of the clock signal varies depending on the load. The output voltage regulator may comprise a feedback loop extending from the DC output voltage and back to a control input of the regulator as schematically illustrated on FIG. 4. Briefly described, an output voltage regulator is configured to apply a pulse skipping mechanism for voltage regulation purposes and controls the charge pump circuit to deliver a single clock pulse, i.e. makes a low-to-high transition followed by a high-to-low transition of the clock signal, when additional charge is required at the converter DC output voltage Vout—for example in response to the DC output voltage drops below a target voltage Vref. In accordance with some embodiments, however, the width of the clock pulse is $K*t_{gsw}$ (where K is a positive odd integer [1, 3, 5 . . . ]. The width of each clock pulse of the clock signal waveform clk illustrated on graph 800 is preferably set approximately equal to the mutual pulse delay $t_{gsw}$ which is about one-half of the predetermined resonance period of the magnetic inductance antenna within the tolerances discussed before. The first and second non-overlapping clock phases p1, p2 are derived from the clock signal, clk, in a corresponding manner to those discussed above. The intra-phase delay time $t_d$ ensures that the first and second clock phases are non-overlapping as discussed above. The present embodiment preferably uses non-segmented switches for each of the previously discussed controllable semiconductor switches SW1, SW2, SW3 and SW4 of the charge pump circuits. Hence, the first and second semiconductor switches SW1, SW2 are driven by the first clock phase p1 and the third and fourth semiconductor switches SW3, SW4 are driven by the second clock phase p2 or vice versa. As illustrated by the charging current $I_{out}$ waveform, pairs of consecutive output charging current pulses p1-1, p1-2; p2-1, p2-2 etc. are repeatedly generated over time during operation of the present SC DC-DC converter similarly to the previously discussed embodiments. The first output or charging current pulse p1-1 is generated in response to the rising edge of the second clock phase p2 while the immediately following, i.e. consecutive, second output current pulse p1-2 is generated in response to the rising edge of the first clock phase p1 and so forth at each rising edge, or on-set, of the first and second clock phases p1, p2. The mutual pulse delay between the first and second output current pulses of each pair of pulses, such as the pulse pair formed by output current pulses p1-1 and p1-2, is set substantially equal to $t_{gsw}$ leading to the previously discussed advantageous suppression of the electromagnetic noise signal induced in the magnetic inductance antenna. This suppression or attenuation of the electromagnetic noise signal is caused by the destructive interference between the pair of antenna noise signals associated with the first and second output charging current pulses.

The obtained suppression of the electromagnetic noise signal induced in the magnetic inductance antenna by selection of the optimum mutual pulse delay is illustrated on graph 802. Graph 812 below illustrates that considerable suppression of the electromagnetic noise signal induced in the magnetic inductance antenna is still possible even a less than optimum mutual pulse delay as discussed previously with reference to the listed tolerances on +/−50%.

The switching noise pulse 805 (full line) on graph 802 induced in the magnetic inductance antenna is simulated using an electrical circuit simulation of an RLC model of the magnetic inductance antenna. The electric RLC model of the magnetic inductance antenna has the following values:

$L_{ant}$=4 µH
$C_{ant}$=63.3 pF
Equivalent resistance ($R_{ant}$)=8 kΩ.

Hence, the magnetic inductance antenna has a resonance frequency of 10 MHz and Q factor=32. The electric simulation is carried out by injecting a scaled version of the charging current $I_{out}$ running out of the SC DC-DC converter, i.e. charging the output capacitor, into the above-mentioned RLC circuit model of the antenna to imitate an arbitrary, but well-defined, magnetic coupling between the charging current $I_{out}$ and the antenna. The switching noise pulse 805 shows the electromagnetic noise voltage induced by the consecutive output charging current pulses p1-1; p1-2 of present SC DC-DC converter where the mutual pulse delay $t_{gsw}$ is set to 50 ns corresponding to one-half of the resonance period of the magnetic inductance antenna. The switching noise pulse 810 (dotted line) is generated in a corresponding manner but now with one-half of the antennal resonance period of approximately 85 ns which deviates from its optimum value of 50 ns with about +70%. The peak amplitude and energy of the switching noise pulse 810 are obviously both markedly larger than those of the switching noise pulse 805.

The switching noise pulse 815 on graph 812 shows the corresponding electromagnetic noise voltage when mutual pulse delay $t_{gsw}$ of 50 ns does not exactly match the one-half of the resonance period of the magnetic inductance antenna. The switching noise pulse 815 is obtained by setting one-half of the resonance period of the magnetic inductance antenna to 62.5 ns such that the mutual pulse delay $t_{gsw}$ deviates by 25% from the optimum time delay discussed above. By comparing the switching noise pulse 805 on graph 802 with the switching noise pulse 815 on graph 812 it is readily evident that the latter sub-optimum value of the mutual pulse delay leads to markedly deterioration of the suppression of the electromagnetic noise voltage compared to the optimum value. On the other hand by comparing the switching noise pulse 815 with the switching noise pulse 810 (dotted line) as generated in the previous graph 800 it is readily apparent that even this sub-optimum value of the mutual pulse delay on 62.5 ns still provides some suppression of the electromagnetic noise voltage induced in the magnetic inductance antenna.

Although features have been shown and described, it will be understood that they are not intended to limit the claimed invention, and it will be made obvious to those skilled in the art that various changes and modifications may be made without departing from the spirit and scope of the claimed invention. The specification and drawings are, accordingly to be regarded in an illustrative rather than restrictive sense. The claimed invention is intended to cover all alternatives, modifications and equivalents.

The invention claimed is:

1. A head-wearable hearing device comprising:
   a magnetic inductance antenna for receipt of wireless data signals; and
   a switched capacitor DC-DC converter configured to convert a DC input voltage into a higher or lower DC output voltage, the switched capacitor DC-DC converter comprising a charge pump circuit configured to charge an output capacitor by output current pulses;
   wherein the output current pulses at least comprise first and second output current pulses with a mutual pulse delay corresponding to substantially one-half of a resonance period of the magnetic inductance antenna.

2. The head-wearable hearing device according to claim 1, further comprising a flying capacitor, wherein the charge pump circuit is configured to, in a first state, charge the output capacitor and the flying capacitor from the DC input voltage.

3. The head-wearable hearing device according to claim 2, wherein the charge pump circuit is configured to, in a second state, discharge the flying capacitor.

4. The head-wearable hearing device according to claim 3, wherein the charge pump circuit is configured to, in the second state, discharge the flying capacitor into the output capacitor.

5. The head-wearable hearing device according to claim 1, wherein the switched capacitor DC-DC converter is configured to convert the DC input voltage into the higher or lower DC output voltage in accordance with a clock signal.

6. The head-wearable hearing device according to claim 5, wherein a frequency of the clock signal is smaller than one-half of the resonance period.

7. The head-wearable hearing device according to claim 5, wherein a frequency of the clock signal is between 250 kHz and 4 MHz.

8. The head-wearable hearing device according to claim 1, wherein the charge pump circuit comprises a switch array driven by first and second non-overlapping clock phases derived from a clock signal, the first and second non-overlapping clock phases corresponding with a first state and a second state, respectively, of the charge pump circuit.

9. The head-wearable hearing device according to claim 8, further comprising a flying capacitor, wherein the switch array comprises:
   first and second controllable semiconductor switches for connecting the flying capacitor between the DC input voltage and the output capacitor during the first clock phase; and
   third and fourth controllable semiconductor switches for connecting the flying capacitor to the output capacitor during the second clock phase.

10. The head-wearable hearing device according to claim 9, wherein:
    each of the first and second controllable semiconductor switches comprises individually controllable first and second switch segments controlled by first and second segment phases, respectively, derived from the first clock phase, wherein an on-set or transition of the second segment phase is delayed relative to an on-set or transition of the first segment phase by the mutual pulse delay; and
    each of the third and fourth controllable semiconductor switches comprises individually controllable first and second switch segments controlled by third and fourth segment phases, respectively, derived from the second clock phase, wherein an on-set or transition of the fourth segment phase is delayed relative to an on-set or transition of the third segment phase by the mutual pulse delay.

11. The head-wearable hearing device according to claim 1, wherein the charge pump circuit is configured to operate based on a clock signal, the clock signal comprising a plurality of clock pulses, wherein each of the clock pulses has a length substantially equals to one-half of the resonance period.

12. The head-wearable hearing device according to claim 1, wherein the charge pump circuit is configured to:
    produce the first output current pulse of the output current pulses in response to an on-state transition of a first clock phase; and
    produce the second output current pulse of the output current pulses in response to an on-state transition of a second clock phase.

13. The head-wearable hearing device according to claim 1, further comprising a flying capacitor, wherein the charge pump circuit is configured to:
produce the first output current pulse of the output current pulses in response to an on-state transition of a first clock phase to at least partially charge the flying capacitor; and
produce the second output current pulse of the output current pulses, at the mutual pulse delay relative to the on-state transition of the first clock phase to increase the charge of the flying capacitor.

14. The head-wearable hearing device according to claim 13, wherein the charge pump circuit is also configured to:
produce a third output current pulse of the output current pulses in response to an on-state transition of a second clock phase to at least partially discharge the flying capacitor; and
produce a fourth output current pulse of the output current pulses at the mutual pulse delay relative to the on-state transition of the second clock phase to further discharge the flying capacitor.

15. The head-wearable hearing device according to claim 1, wherein the resonance period is between 20 ns and 200 ns.

16. The head-wearable hearing device according to claim 15, wherein the resonance period corresponds with a resonance frequency that is between 5 MHz and 50 MHz.

17. The head-wearable hearing device according to claim 1, further comprising a control and processing circuit coupled to the switched capacitor DC-DC converter, the control and processing circuit comprising:
a first audio input channel for receipt of a first audio signal,
a signal processor for processing of the first audio signal to generate a compensated microphone signal according to a hearing loss of a user;
an amplifier configured to provide a modulated output signal based on the compensated microphone signal, and
a receiver or loudspeaker for providing output sound signal based on the modulated output signal.

18. The head-wearable hearing device according to claim 1, further comprising a rechargeable battery source for providing the DC input voltage.

19. The head-wearable hearing device according to claim 1, wherein the mutual pulse delay equals one-half of the resonance period of the magnetic inductance antenna within a tolerance of +/−50%, +/−25%, or +/−10%.

20. The head-wearable hearing device according to claim 1, wherein the charge pump circuit is configured to produce peak currents associated with the first and second output current pulses, the peak currents being identical or having a difference less than 50%, 25%, or 10%.

21. A method performed by a head-wearable hearing device having a magnetic inductance antenna and a switched capacitor DC-DC converter, the method comprising:
generating a clock signal;
applying the clock signal to the switched capacitor DC-DC converter to convert a DC input voltage into a higher or lower DC output voltage at an output capacitor;
supplying output current pulses into the output capacitor for charging the output capacitor; and
setting a time delay between at least first and second output current pulses of the output current pulses equal to substantially one-half of a resonance period of the magnetic inductance antenna.

22. The method according to claim 21, further comprising repeating the act of setting the time delay to apply a pair of additional output current pulses to the output capacitor to repeat a charging of the output capacitor.

23. The method according to claim 21, further comprising:
deriving first and second non-overlapping clock phases from the clock signal;
charging a flying capacitor in the hearing device and the output capacitor during the first clock phase; and
discharging the flying capacitor during the second clock phase.

* * * * *